US008169083B2

(12) United States Patent
Igarashi

(10) Patent No.: US 8,169,083 B2
(45) Date of Patent: May 1, 2012

(54) SEMICONDUCTOR DEVICE

(75) Inventor: Yohei Igarashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 80 days.

(21) Appl. No.: 12/644,416

(22) Filed: Dec. 22, 2009

(65) Prior Publication Data

US 2010/0155965 A1 Jun. 24, 2010

(30) Foreign Application Priority Data

Dec. 24, 2008 (JP) ................................. 2008-328327

(51) Int. Cl.
*H01L 23/13* (2006.01)
(52) U.S. Cl. ......... 257/778; 257/E21.503; 257/E23.123; 438/108; 438/127; 264/459; 264/494
(58) Field of Classification Search .................. None
See application file for complete search history.

(56) References Cited

U.S. PATENT DOCUMENTS

| 5,218,234 | A | * | 6/1993 | Thompson et al. | ........... 257/787 |
| 5,920,126 | A | * | 7/1999 | Sohara | ........... 257/778 |
| 6,160,308 | A | * | 12/2000 | Aoki | ........... 257/678 |
| 6,559,390 | B1 | * | 5/2003 | Tanaka | ........... 174/260 |
| 6,734,567 | B2 | * | 5/2004 | Chiu et al. | ........... 257/778 |
| 7,033,864 | B2 | * | 4/2006 | Libres et al. | ........... 438/118 |
| 7,375,433 | B2 | * | 5/2008 | Kuramochi | ........... 257/778 |
| 7,400,048 | B2 | * | 7/2008 | Choi | ........... 257/778 |
| 7,432,602 | B2 | * | 10/2008 | Kuramochi | ........... 257/783 |
| 7,550,856 | B2 | * | 6/2009 | Libres et al. | ........... 257/777 |
| 7,759,802 | B2 | * | 7/2010 | Miyazaki | ........... 257/778 |
| 7,902,678 | B2 | * | 3/2011 | Ohuchi et al. | ........... 257/778 |
| 2006/0273461 | A1 | * | 12/2006 | Otsuka | ........... 257/754 |
| 2007/0269930 | A1 | * | 11/2007 | Gupta et al. | ........... 438/108 |
| 2008/0203564 | A1 | * | 8/2008 | Motoyoshi et al. | ........... 257/737 |
| 2008/0246163 | A1 | * | 10/2008 | Tanida et al. | ........... 257/778 |
| 2008/0251942 | A1 | * | 10/2008 | Ohuchi et al. | ........... 257/778 |
| 2009/0250812 | A1 | * | 10/2009 | Araki et al. | ........... 257/737 |
| 2009/0294978 | A1 | * | 12/2009 | Ota et al. | ........... 257/773 |

FOREIGN PATENT DOCUMENTS

| JP | H11-150206 | * | 6/1999 |
| JP | 2002-270642 | * | 9/2002 |
| JP | 2005-175113 | | 6/2005 |
| JP | 2007-110081 | * | 4/2007 |

* cited by examiner

*Primary Examiner* — Steven Loke
*Assistant Examiner* — Victoria Hall
(74) *Attorney, Agent, or Firm* — Rankin, Hill & Clark LLP

(57) ABSTRACT

A semiconductor device includes a wiring substrate having a mounting surface on which a semiconductor element is mounted. A portion of the mounting surface exposed from the semiconductor element is covered by a solder-resist layer, and an extension portion of the solder-resist layer extends from a dropping-commencing point of a liquid-state under-filling agent on the portion of the mounting surface exposed from the semiconductor element and into an area of the wiring substrate covered by the semiconductor element. A gap between the semiconductor element and the extension portion of the solder-resist layer is formed to be narrower than the gap between the semiconductor element and the mounting surface of the wiring substrate so that liquid drops of the under-filling agent dropped at the dropping-commencing point are sucked into the gap by a capillary phenomenon.

3 Claims, 6 Drawing Sheets

US 8,169,083 B2

SEMICONDUCTOR DEVICE

CROSS-REFERENCE TO RELATED APPLICATION

This application is based on and claims priority under 35 U.S.C. §119 from Japanese Patent Application No. 2008-328327 filed on Dec. 24, 2008.

BACKGROUND OF THE INVENTION

1. Technical Field

The present invention relates to a semiconductor device, in further detail, to a semiconductor device having electrode terminals corresponding to a semiconductor element connected to each of a plurality of pads formed on a mounting surface of a wiring substrate in the form of a flip-chip.

2. Related Art

A semiconductor device shown in FIG. 4 has electrode terminals 106 corresponding to a semiconductor element 104 connected to each of a plurality of pads 102 formed on amounting surface of a wiring substrate 100 in the form of a flip-chip.

An under-filling agent (epoxy-based thermo-hardening type resin, etc.) is filled in the gap between such a semiconductor element 104 and the mounting surface of the wiring substrate 100, thereby forming an under-filling layer 108. The under-filling agent is usually in a liquid-state. After the under-filling agent is filled in the gap between the semiconductor element 104 and the mounting surface of the wiring substrate 100, the agent is hardened by a heating process.

However, since the under-filling agent is in a liquid-state, a part thereof flows out on a solder-resist layer 107, which covers the mounting surface of the wiring substrate 100 exposed from mounted semiconductor element 104 when the under-filling agent is filled in the gap between the semiconductor element 104 and the mounting surface of the wiring substrate 100. Accordingly, as shown in FIG. 4, where peripherally disposed pads 110 are formed in the vicinity of the outer circumferential edge of the wiring substrate 100, a dam 112 or a recessed groove (not illustrated) is provided in order to prevent the under-filling agent from flowing out to the pads 110.

However, in accordance with advancements in downsizing of a semiconductor device in recent years, it has become impossible to provide a dam 112 or a recessed groove in order to prevent the under-filling agent from flowing out.

A semiconductor device not having such a dam 112 or a recessed groove is described in, for example, JP-A-No. 2005-175113. FIG. 5 is a front elevational view of the semiconductor device described in JP-A-No. 2005-175113, and FIG. 6 is a partial sectional view thereof. In the semiconductor device shown in FIGS. 5 and 6, a rectangular semiconductor element 204 has respective electrode terminals 206 thereof connected to pads 202 formed on the mounting surface of a wiring substrate 200 in the form of a flip-chip on the mounting surface of the wiring substrate 200.

The solder-resist layer 208 covers the mounting surface of the wiring substrate 200 along the outer circumferential edge of the wiring substrate 200 so that the mounting surface of the wiring substrate 200 is exposed to be band-shaped along the outer-circumferential edge of such a semiconductor element 204. Peripherally disposed pads 212 connected by the electrode terminals 206 of the semiconductor element 204 and the wiring pattern 210 are exposed to the bottom surface of the recessed part formed along the outer-circumferential edge of the wiring substrate 200 in the solder-resist layer 208.

In addition, a rectangular opening part 214 in which the solder-resist layer 208 is retracted and the mounting surface of the wiring substrate 200 is greatly exposed is formed at four corners of the semiconductor element 204.

SUMMARY OF THE INVENTION

According to the semiconductor device shown in FIGS. 5 and 6, as shown in FIG. 7, dropping of a liquid-state under-filling agent is commenced through one of the opening parts 214 formed at four corners of the rectangular semiconductor element 204, and the liquid-state under-filling agent is dropped on the band-shaped exposed portion of the mounting surface of the wiring substrate 200, which is exposed along the outer-circumferential edge of the semiconductor element 204. Dropping of such a liquid-state under-filling agent is carried out along two sides of the outer-circumferential edge of the semiconductor element 204 as shown by the arrow of FIG. 7.

As described above, by dropping the liquid-state under-filling agent, the under-filling agent is filled in the gap between the semiconductor element 204 and the mounting surface of the wiring substrate 200.

However, based on the examination made by the present inventor, the gap between the semiconductor element 204 and the mounting surface of the wiring substrate 200 is narrowed in accordance with a demand for thinning of semiconductor devices, and the under-filling agent could not enter the gap between the semiconductor element 204 and the mounting surface of the wiring substrate 200 when commencing to drop the liquid-state under-filling agent into the opening parts 214, wherein there may be cases where the liquid-state under-filling agent overflows from the opening parts 214, and overflows onto the peripherally disposed pads 212 as shown in FIG. 7.

Therefore, the present invention solves a problem of a conventional semiconductor device, by which the liquid-state under-filling agent hardly enters the gap between the semiconductor element and the mounting surface of the wiring substrate when the gap between the semiconductor element and the mounting surface of the wiring substrate is narrowed, and it is therefore an object of the present invention to provide a semiconductor device in which a liquid-state under-filling agent can easily enter the gap between a semiconductor element and the mounting surface of a wiring substrate even if the gap between the semiconductor element and the mounting surface of the wiring substrate is narrowed.

As a result of an examination made to solve the object by the present inventor, the inventor found, by further narrowing the gap between the semiconductor element at the dropping-commencing point of the liquid-state under-filling agent and the vicinity thereof and an extension portion of the solder-resist layer than the gap between a semiconductor element and a mounting surface of the wiring substrate, that liquid drops of dropped liquid-state under-filling agent easily enter the gap between the semiconductor element and the mounting surface of the wiring substrate, and reached the present invention.

That is, according to a first aspect of the invention, there is provided a semiconductor device including:

a plurality of pads formed on a mounting surface of a wiring substrate in the form of a flip-chip, and electrode terminals corresponding to a semiconductor element connected to each of the plurality of pads, wherein the mounting surface of the wiring substrate exposed from the semiconductor element is covered by a solder-resist layer in which an outer-circumferential edge of the semiconductor element or the vicinity thereof is made into an inner-side edge thereof, a part of the solder-resist layer covering the mounting surface of the wiring substrate at a dropping-commencing point at which dropping of a liquid-state under-filling agent filled in a gap between the semiconductor element and the mounting surface of the wiring substrate is commenced is extended in an area of the wiring substrate covered by the semiconductor element, and a gap between the semiconductor element at the dropping-commencing point and the vicinity thereof and an extension portion of the solder-resist layer is formed to be narrower than the gap between the semiconductor element and the mounting surface of the wiring substrate so that liquid drops of the under-filling agent dropped at the dropping-commencing point are sucked into the gap by a capillary phenomenon.

According to a second aspect of the invention, there is provided the semiconductor device as in the first aspect, wherein the mounting surface of the wiring substrate exposed from the semiconductor element is covered by the solder-resist layer so that, excluding the portion covered by the solder-resist layer extended in the area of the wiring substrate covered by the semiconductor element, the mounting surface is exposed to be band-like along the outer-circumferential edge of the semiconductor element.

Thereby, dropping of a liquid-state under-filling agent can be performed on the mounting surface exposed to be band-like from the dropping-commencing point.

Further, according to a third aspect of the invention, there is provided the semiconductor device as in the first or second aspect, wherein the gap between the semiconductor element at the dropping-commencing point and the vicinity thereof and the extension portion of the solder-resist layer is formed to be 10 μm to 20 μm.

Generally, in order to seal the gap between the mounting surface having a solder-resist layer of a wiring substrate formed and the semiconductor element, a liquid-state under-filling agent dropped in the vicinity of the outer-circumferential edge of a semiconductor element advances in two directions, one of which is the direction along the edge of a contacted semiconductor element or of the solder-resist layer, and the other of which is the direction along which the under-filling agent is sucked into the gap between the semiconductor element and the mounting surface by a capillary phenomenon.

A sucking force of the under-filling agent by such a capillary phenomenon depends on the gap between the semiconductor element and the mounting surface of a wiring substrate.

However, in a conventional semiconductor device, solder-resist layer is not formed at the mounting point of a wiring substrate, at which a semiconductor element is mounted, and the gap between the semiconductor element and the mounting surface of the wiring substrate is large, wherein a force for an under-filling agent to be spread in the edge direction of the semiconductor element or the solder-resist layer becomes greater than a sucking force of the under-filling agent into the gap between the semiconductor element and the mounting surface. Therefore, overflow of the under-filling agent is brought about.

In this point, in the semiconductor device according to the present invention, a part of the solder-resist layer covering the mounting surface of a wiring substrate at the dropping-commencing point where dropping of a liquid-state under-filling agent is commenced extends in the area of the wiring substrate covered by the semiconductor element, and the gap of the semiconductor element at the dropping-commencing point and the vicinity thereof and the extension portion of the solder-resist layer is formed to be narrower than the gap between the semiconductor element and the mounting surface of the wiring substrate.

Accordingly, with respect to liquid drops of the under-filling agent dropped onto such a dropping-commencing point, a sucking force into the gap between the semiconductor element and the extension portion of the solder-resist layer by a capillary phenomenon further greatly operates than the spreading force of the semiconductor element or the solder-resist layer in the edge direction.

Further, a force of spreading in the inner direction of the gap between the semiconductor element and the mounting surface of the wiring substrate along the edge of the extension portion of the solder-resist layer operates on the liquid drops of the under-filling agent.

Resultantly, the liquid drops of the under-filling agent dropped at the dropping-commencing point are sucked into the gap between the semiconductor element and the mounting surface of the wiring substrate.

Accordingly, the under-filling agent dropped at the dropping-commencing point enters the gap between the semiconductor element and the mounting surface of the wiring substrate, and the under-filling agent can be prevented from overflowing in the outer-circumferential edge direction of the wiring substrate.

As described above, after the under-filling agent dropped at the dropping-commencing point is once sucked into the gap between the semiconductor element and the mounting surface of the wiring substrate, the under-filling agent can be filled in the gap between the semiconductor element and the mounting surface of the wiring substrate by dropping the under-filling agent onto the mounting surface of the wiring substrate exposed to be band-like along the outer-circumferential edge of the semiconductor element.

With the semiconductor device according to the present invention, since it is not necessary to provide any dam or recessed groove to prevent the under-filling agent from flowing out, this contributes to downsizing of semiconductor devices. Furthermore, even if the gap between the semiconductor element and the mounting surface of the wiring substrate is narrowed, the under-filling agent can be filled, and this contributes to thinning of the semiconductor devices.

DETAILED DESCRIPTION OF THE PREFERRED EMBODIMENTS

Figure 1:
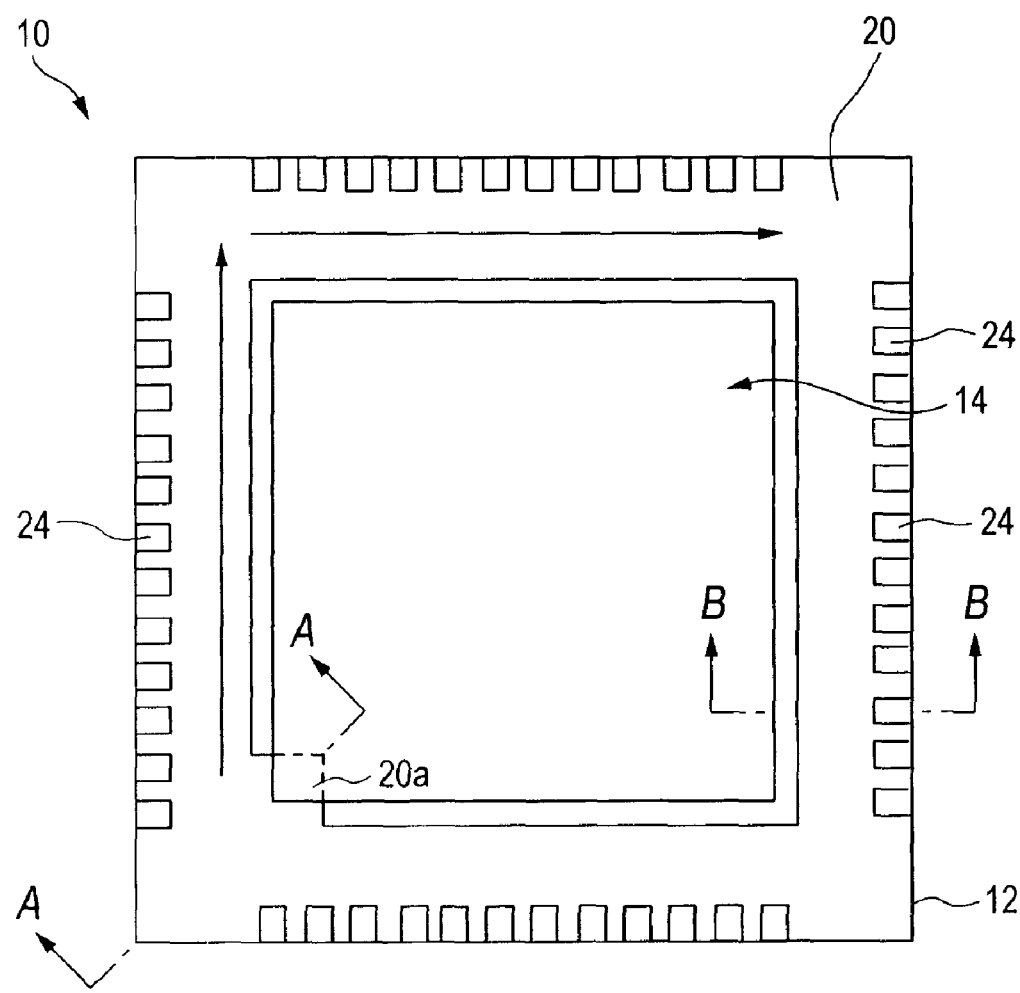
FIG. 1 is a front elevational view for describing one example of a semiconductor device according to the present invention.
Figure 2A:
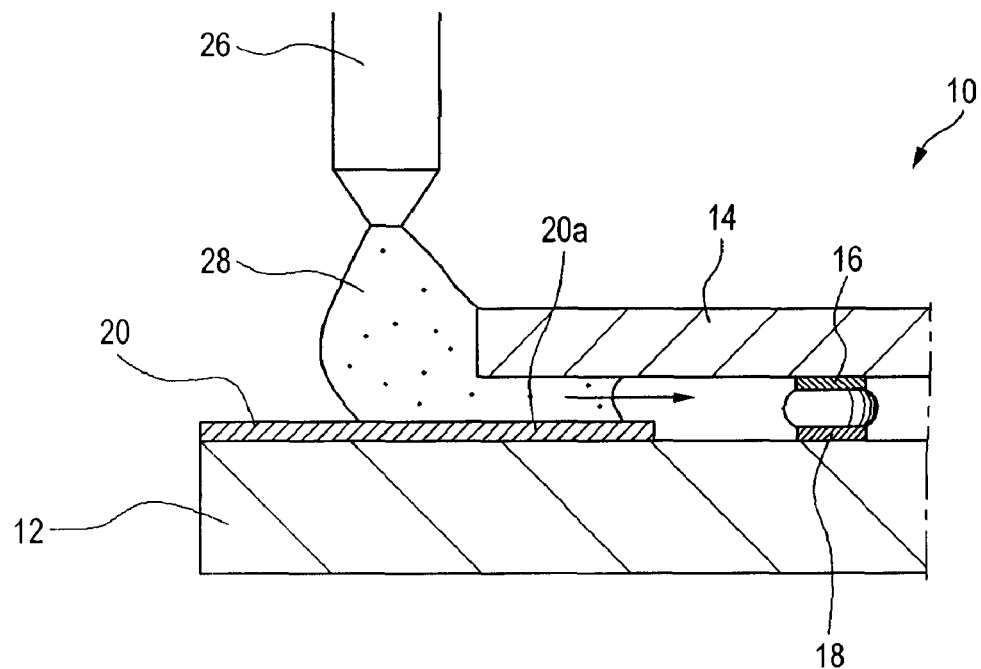
FIGS. 2A and 2B are partially sectional views taken along the lines A-A and B-B of the semiconductor device shown in FIG. 1.
Figure 2B:
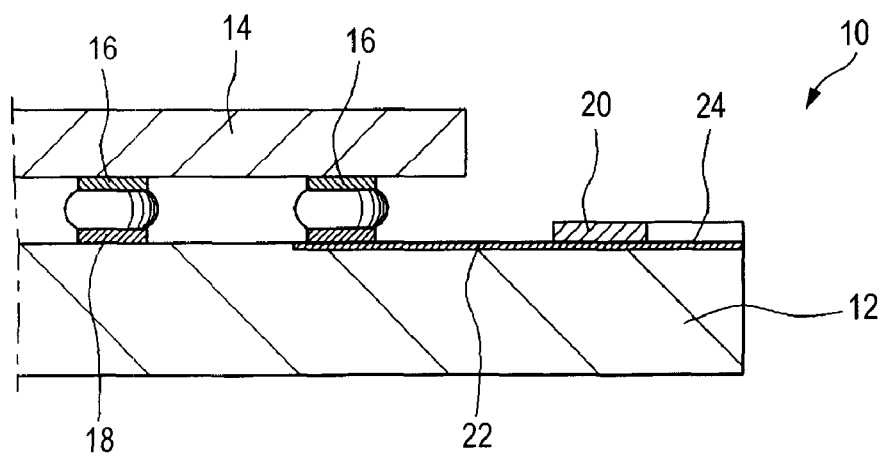

FIGS. 1, 2A and 2B show one example of a semiconductor device according to the present invention. FIG. 1 is a front elevational view of a semiconductor device 10, FIG. 2A is a partially sectional view taken along the line A-A shown in FIG. 1, and FIG. 2B is a partially sectional view taken along the line B-B shown in FIG. 1.

The semiconductor device 10 shown in FIGS. 1, 2A and 2B includes pads 18 formed on the mounting surface of a wiring substrate 12, and electrode terminals 16 of a rectangular-shaped semiconductor element 14 respectively connected to pads 18 in the form of a flip-chip.

A solder-resist layer 20 covers the mounting surface of the wiring substrate 12 exposed from the semiconductor element 14 so that the mounting surface of the wiring substrate 12 is exposed to be band-like along the outer-circumferential edge of such a semiconductor element 14.

The peripherally disposed pad 24 connected to the electrode terminal 16 of the semiconductor element 14 by means of a wiring pattern 22 is exposed to the bottom surface of the recessed extension part 20a of the solder-resist layer 20. Such a peripherally disposed pad 24 is peripherally disposed along the outer circumferential edge of the wiring substrate 12.

In such a semiconductor device 10, the mounting surface of the wiring substrate 12 equivalent to one corner of the rectangular-shaped semiconductor element 14 is covered by a rectangular extension portion 20a extending from the solder-resist layer 20 as shown in FIGS. 1 and 2A. Therefore, the gap between the semiconductor element 14 and the extension portion 20a of the solder-resist layer 20 is formed to be narrower than the gap between the semiconductor element 14 and the mounting surface of the wiring substrate 12.

At the part where the extension portion 20a of the solder-resist layer 20 is not formed, the mounting surface of the wiring substrate 12 is exposed to be band-like along the outer-circumferential edge of the semiconductor element 14.

In addition, although the wiring pattern 22 is provided on a portion of the mounting surface of the wiring substrate 12 and is exposed to be band-like along the outer-circumferential edge of the semiconductor element 14, the wiring pattern 22 is omitted in FIG. 1.

Figure 3:
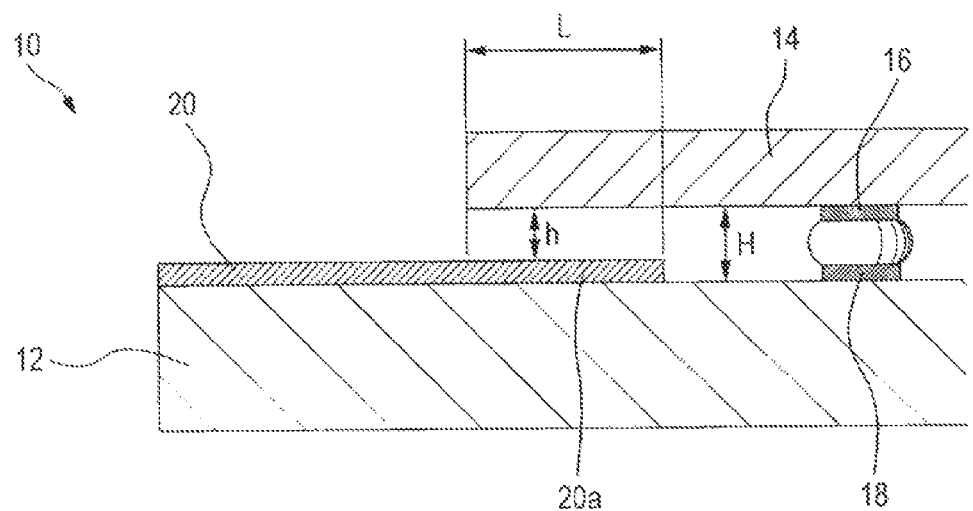
FIG. 3 is an enlarged partially sectional view taken along the line A-A of the semiconductor device shown in FIG. 1.
Figure 4:
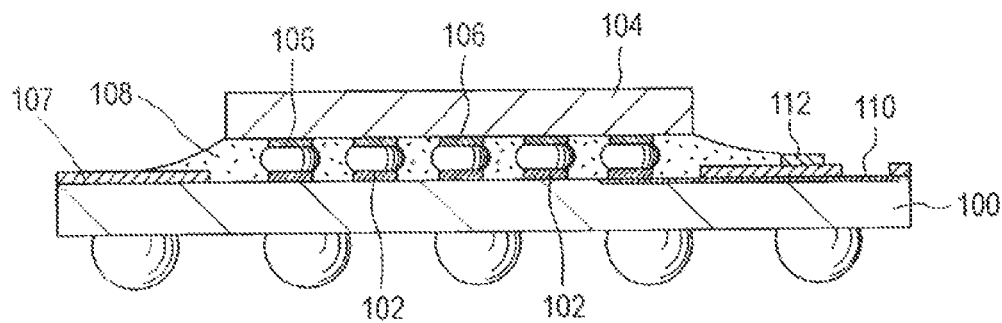
FIG. 4 is a longitudinally sectional view describing one example of a conventional semiconductor device.
Figure 5:
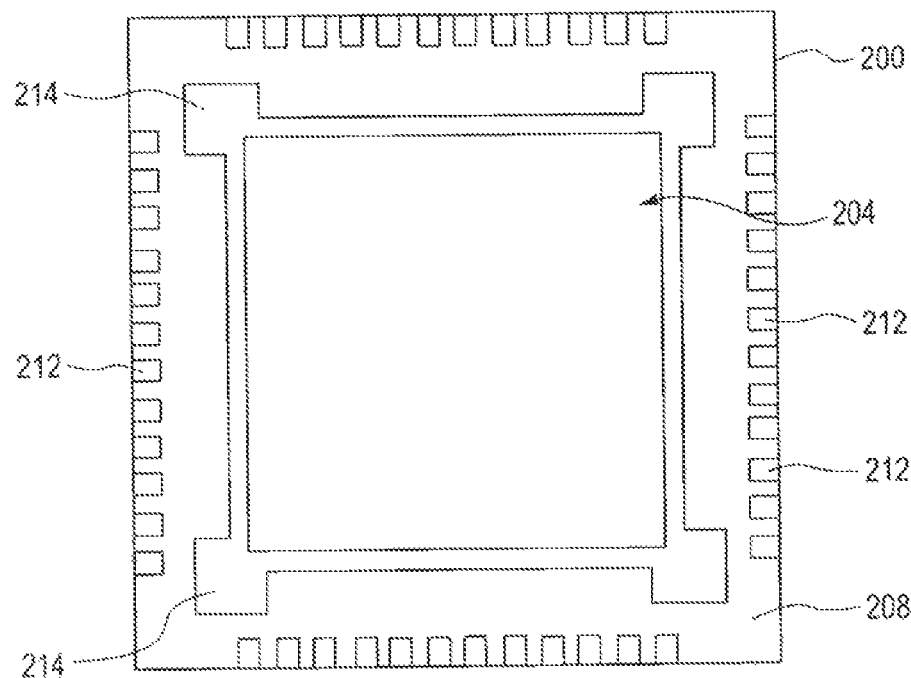
FIG. 5 is a front elevational view describing another example of a conventional semiconductor device.
Figure 6:
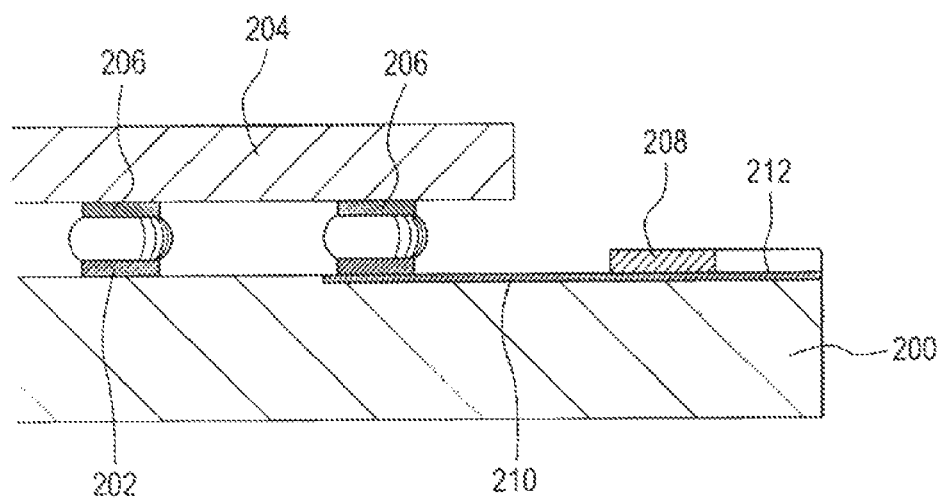
FIG. 6 is a partially sectional view showing the semiconductor device shown in FIG. 5.
Figure 7:
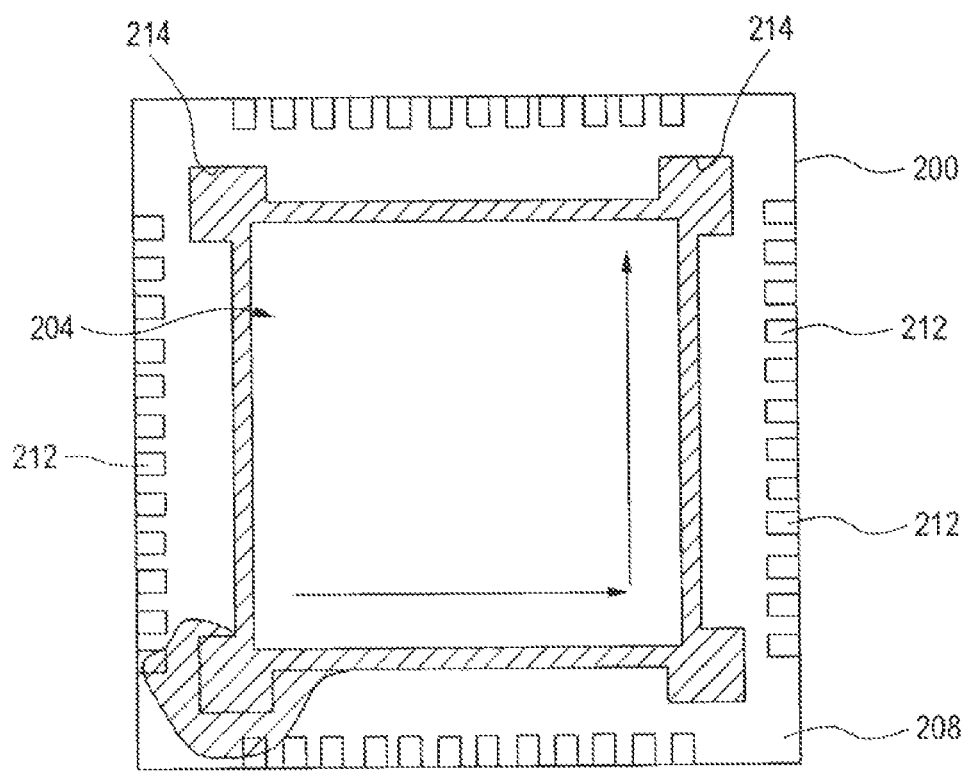
FIG. 7 is a schematic view describing a state where an under-filling agent is filled in the gap between a semiconductor element of the semiconductor device shown in FIG. 5 and the mounting surface of a wiring substrate thereof.

In the semiconductor device shown in FIGS. 1, 2A and 2B, the interval h between the semiconductor element 14 and the extension portion 20a of the solder-resist layer 20 is narrower than the interval H (30 through 35 μm between the semiconductor element 14 and the mounting surface of the wiring substrate 12 as shown in FIG. 3, and is made into such an interval by which liquid drops of the under-filling agent are sucked into the gap between the semiconductor element 14 and the mounting surface of the wiring substrate 12 by a capillary phenomenon.

The narrower the interval h becomes, the greater the effect of the capillary phenomenon becomes. However, it is preferable that the interval h is 10 μm or more, 10 through 25 μm, in particular, 15 through 20 μm in order to prevent a void from being formed in the under-filling layer formed in the gap between the semiconductor element 14 and the mounting surface of the wiring substrate 12.

In addition, it is preferable that the maximum length L of the extension portion 20a of the solder-resist layer 20 is approximately 100 μm.

As shown in FIG. 2A, a nozzle 26 for dropping the under-filling agent is provided in the vicinity of the extension portion 20a of the solder-resist layer 20 of the semiconductor device 10 shown in FIGS. 1 to 3, and the under-filling agent 28 is dropped onto the solder-resist layer 20 in the vicinity of the extension portion 20a.

Liquid drops of the dropped under-filling agent 28 are sucked into the gap between the semiconductor element 14 and the mounting surface of the wiring substrate 12, as shown by the arrow in FIG. 2A, through the interval h between the semiconductor element 14 and the extension portion 20a of the solder-resist layer 20 by a capillary phenomenon.

Further, a spreading force in the inner direction of the gap between the semiconductor element 14 and the mounting surface of the wiring substrate 12 operates on liquid drops of the dropped under-filling agent 28 along the edge of the extension portion 20a of the solder-resist layer 20.

Accordingly, there is no case where the dropped under-filling agent 28 overflows in the outer-circumferential edge direction of the wiring substrate 12, and the peripherally disposed pads 24 can be prevented from being covered by the under-filling agent 28.

As described above, after liquid drops of the under-filling agent 28 are once sucked into the gap between the semiconductor element 14 and the mounting surface of the wiring substrate 12, the under-filling agent 28 subsequently dropped from the nozzle 26 can easily enter the gap between the semiconductor element 14 and the mounting surface of the wiring substrate 12 by the surface tension thereof.

Accordingly, by dropping the under-filling agent 28 from the nozzle 26 onto the exposed surface, where the mounting surface of the wiring substrate 12 is exposed to be band-shaped along the outer-circumferential edge of the semiconductor element 14 as shown by the arrow in FIG. 1 while moving the nozzle 26 along two sides of the semiconductor element 14, the gap between the semiconductor element 14 and the mounting surface of the wiring substrate 12 can be filled with the under-filling agent 28.

In the semiconductor device 10 shown in FIGS. 1 to 3, since is not necessary to provide any dam or recessed groove to prevent the under-filling agent 28 from flowing out, the semiconductor device 10 can be downsized.

Further, even if the interval H between the semiconductor element 14 and the mounting surface of the wiring substrate 12 is narrowed, the under-filling agent 28 can still be used, where thinning of the semiconductor device 10 can be achieved.

In the semiconductor device 10 shown in FIGS. 1 to 3, although peripherally disposed pads 24 are formed along the outer-circumferential edge of the wiring substrate 12, these pads may be substituted by pads for external connection terminals by vias at the side opposed to the mounting surface of the wiring substrate 12.

Also, in the semiconductor device 10 shown in FIGS. 1 to 3, although the extension portion 20a of the solder-resist layer 20 is provided at one corner part of the semiconductor element 14, the extension portion 20a of the solder-resist layer 20 may be provided at any one of the sides of the semiconductor element 14. For this reason, the extension portion 20a of the solder-resist layer 20 may be provided halfway along the side part of the semiconductor element 14.

Further, in the semiconductor device 10 shown in FIGS. 1 to 3, although the mounting surface of the wiring substrate 12 is covered by the solder-resist layer 20 so that the mounting surface of the wiring substrate 12 is exposed to be band-like along the outer-circumferential edge of the semiconductor element 14, the mounting surface of the wiring substrate 12 exposed from the semiconductor element 14 may be covered by the solder-resist layer 20 so that the outer-circumferential edge of the semiconductor element 14 is roughly coincident with the inside edge of the solder-resist layer 20.

What is claimed is:

1. A semiconductor device comprising:

a wiring substrate having a mounting surface with a plurality of pads formed thereon in the form of a flip-chip, and a semiconductor element having electrode terminals connected to each of the plurality of pads, wherein a first portion of the mounting surface is a portion which is partially overlaid and covered by the semiconductor element, a second portion of the mounting surface is a portion which is exposed from the semiconductor element, and the plurality of pads are formed on the first portion of the mounting surface, a solder-resist layer is formed on the second portion of the mounting surface so as to surround the first portion of the mounting surface and the semiconductor element, at least one extension portion of the solder-resist layer at a dropping-commencing point is continuous with the solder-resist layer formed on the second portion of the mounting surface and extends from the solder-resist layer formed on the second portion of the mounting surface to the first portion of the mounting surface covered by the semiconductor element, the at least one extension portion overlapping with at least one corner portion of the semiconductor element when viewed from a top, wherein the only area of the first portion of the mounting surface covered by the solder-resist layer is covered by the at least one extension portion of the solder resist layer such that areas of the first portion of the mounting surface are exposed from the solder-resist layer and the plurality of pads, and the dropping-commencing point is a position configured to have a dropping of a liquid state under-filling agent commenced thereat, and a gap between the semiconductor element at the dropping-commencing point and the extension portion of the solder-resist layer is formed to be narrower than a gap between the semiconductor element and the mounting surface of the wiring substrate so that liquid drops of the under-filling agent dropped at the dropping-commencing point are sucked into the gap by a capillary phenomenon, wherein the solder-resist layer covers the second portion of the mounting surface so as to expose a band-like area of the mounting surface around the outer-circumferential edge of the semiconductor element, and the extension portion of the solder-resist layer is formed to cross the band-like exposed area of the mounting surface.

2. The semiconductor device as in claim 1, wherein the gap between the semiconductor element at the dropping-commencing point and the extension portion of the solder-resist layer is formed to be 10 µm to 20 µm.

3. The semiconductor device as in claim 1, wherein the at least one extension portion is a single extension portion, and the extension portion overlaps with one corner portion of the semiconductor element when viewed from a top.

* * * * *